(12) United States Patent
Jin

(10) Patent No.: US 7,186,647 B2
(45) Date of Patent: Mar. 6, 2007

(54) METHOD FOR FABRICATING SEMICONDUCTOR DEVICE HAVING LANDING PLUG CONTACT STRUCTURE

(75) Inventor: Seung-Woo Jin, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 119 days.

(21) Appl. No.: 10/968,940

(22) Filed: Oct. 21, 2004

(65) Prior Publication Data

US 2005/0287801 A1    Dec. 29, 2005

(30) Foreign Application Priority Data

Jun. 23, 2004    (KR) .................... 10-2004-0047263

(51) Int. Cl.
*H01L 21/44*    (2006.01)
(52) U.S. Cl. .................... 438/672; 438/475; 257/E21; 257/17; 257/319
(58) Field of Classification Search ................ 438/672, 438/238, 381, 680, 692, 700, 637, 474, 475
See application file for complete search history.

(56) References Cited

U.S. PATENT DOCUMENTS

| 6,187,627 | B1 * | 2/2001 | Chen et al. .................. 438/253 |
| 6,476,488 | B1 * | 11/2002 | Jeng et al. .................. 257/751 |
| 6,852,592 | B2 * | 2/2005 | Lee et al. .................. 438/253 |
| 6,927,168 | B2 * | 8/2005 | Song .......................... 438/692 |
| 7,045,450 | B2 * | 5/2006 | Lee et al. .................. 438/597 |

* cited by examiner

*Primary Examiner*—David Nhu
(74) *Attorney, Agent, or Firm*—McDermott Will & Emery LLP

(57) ABSTRACT

The present invention relates to a method for fabricating a semiconductor device with a landing plug contact structure. The method includes the steps of: forming a plurality of gate structures on a substrate; sequentially forming a first spacer and a second spacer on sidewalls of each gate structure; forming a plurality of landing plug contacts in a predetermined regions created between the gate structures; and forming a passivation layer on a resulting substrate structure including the first and the second spacers, the landing plug contacts and the gate structures. Particularly, the passivation layer which serves to prevent hydrogen ions from diffusing into a channel region is obtained by doping an N-type dopant capable of capturing hydrogen ions. The passivation layer is also obtained by forming a nitride layer capable of preventing the diffusion of hydrogen ions.

18 Claims, 3 Drawing Sheets

METHOD FOR FABRICATING SEMICONDUCTOR DEVICE HAVING LANDING PLUG CONTACT STRUCTURE

FIELD OF THE INVENTION

The present invention relates to a method for fabricating a semiconductor device; and, more particularly, to a method for a semiconductor device having a landing plug contact structure.

DESCRIPTION OF RELATED ARTS

As a semiconductor device has been highly integrated, a distance between conductive structures has been conversely decreased, and as a result, a margin for a contact formation process has been also decreased. Therefore, a landing plug contact structure has been widely used to secure a sufficient contact process margin.

A landing plug contact formation process is a technique for securing an overlay margin during a subsequent contact formation process by burying polysilicon precedently between gate structures in which a bit line contact and a storage node contact are formed.

FIG. 1 is a cross-sectional view of a dynamic random access memory (DRAM) device in which a plurality of landing plug contacts are formed. Hereinafter, a conventional DRAM fabrication process will be described.

As shown, a device isolation layer 11 is formed in a substrate 10, thereby defining an active region, and a gate oxide layer 13 and a gate conductive material 14 including polysilicon and/or a metal are sequentially formed on the substrate 10. A nitride layer 15 for forming a gate hard mask is then formed on the gate conductive material 14.

Subsequently, the nitride layer 15 is patterned by performing a photolithography process with use of a mask for use in a gate structure. The patterned nitride layer 15 is then used as an etch mask to pattern the gate conductive material 14 and the gate oxide layer 13. From these sequential steps, a plurality of gate structures G are formed.

Afterwards, an ion implantation of a low concentration for forming a source/drain junction is performed to exposed portions of the active region by using each gate structure G as an ion implantation mask. Then, a dual spacer S including a buffer oxide layer and a nitride layer is formed on sidewalls of each gate structure G. Herein, a first part of the spacer S based on the buffer oxide layer will be referred to as an oxide-based spacer denoted with a reference numeral 16, while a second part of the spacer S based on the nitride layer will be referred to as a nitride-based spacer denoted with a reference numeral 17. After the formation of the dual spacer S, another ion implantation of a high concentration is performed to form source/drain junctions 12.

An inter-layer insulation layer 18 is formed on the above resulting substrate structure and is then etched by employing a photolithography process with use of a T-shaped mask or an I-shaped mask both for forming a landing plug contact (LPC). Thereafter, a polysilicon layer for use in a LPC is formed on an entire surface of the above constructed substrate structure. A chemical mechanical polishing (CMP) process for planarizing the polysilicon layer is carried out until the patterned nitride layer 15 is exposed, thereby forming a plurality of LPCs 19. Although not illustrated, another inter-layer insulation layer is formed on the planarized substrate structure, and a typical bit line formation process and a capacitor formation process are sequentially performed.

Generally, nitride is used as a material for forming a spacer on sidewalls of a gate structure. However, because of stress generated from the nitride itself, there are problems such as a hot carrier effect in cell transistors and decrease in currents in a cell region. For these reasons, the buffer oxide layer is specifically employed as a spacer material in order to solve the above problems induced by the use of nitride.

Meanwhile, high density plasma (HDP) oxide is commonly used as an inter-layer insulation material for providing an electrical insulation between a bit line and a gate electrode, i.e., a word line. However, this use of HDP oxide also causes a problem that hydrogen ions generated from a source gas used during depositing the HDP oxide layer diffuse into a channel region of a bottom part of a gate structure and deactivate a doped dopant, e.g., boron. If the dopant in the channel region becomes deactivated, a degree of decrement in threshold voltage ($V_t$) in a cell region varies locally depending on a degree of the deactivation. As a result of this variable descending threshold voltage, uniformity of the threshold D voltage is deteriorated, further causing problems that a transistor characteristic such as a punch-through breakdown voltage (Bvds) becomes degraded and saturation currents of a drain ($I_{dsat}$) decrease.

Meanwhile, instead of using the HDP oxide, it is possible to apply another material for forming an inter-layer insulation layer. Since a source gas for depositing most of oxide materials contains hydrogen, it may be fundamentally difficult to prevent generation of hydrogen ions although there is a slight variation in degrees of the hydrogen ion generation.

SUMMARY OF THE INVENTION

It is, therefore, an object of the present invention to provide a method for fabricating a semiconductor device capable of preventing hydrogen ions from diffusing into a channel region during formation of an inter-layer insulation layer proceeding after a landing plug contact formation process.

In accordance with an aspect of the present invention, there is provided a method for fabricating a semiconductor device, including the steps of: forming a plurality of gate structures on a substrate; sequentially forming a first spacer and a second spacer on sidewalls of each gate structure; forming a plurality of landing plug contacts in a predetermined regions created between the gate structures; and forming a passivation layer on a resulting substrate structure including the first and the second spacers, the landing plug contacts, the gate structures and the substrate.

In accordance with another aspect of the present invention, there is provided a method for fabricating a semiconductor device, including the steps of: forming a plurality of gate structures on a substrate; sequentially forming a first spacer and a second spacer on sidewalls of each gate structure; forming a plurality of landing plug contacts in a predetermined regions created between the gate structures; and doping an N-type dopant to a resulting substrate structure including the first and the second spacers, the landing plug contacts, the gate structures, and the substrate.

In accordance with further another aspect of the present invention, there is provided a method for fabricating a semiconductor device, including the steps of: forming a plurality of gate structures on a substrate; sequentially forming a first spacer and a second spacer on sidewalls of each gate structure; forming a plurality of landing plug contacts in a predetermined regions created between the gate structures; and forming a capping nitride layer on a resulting substrate structure including the first and the second spacers, the landing plug contacts, the gate structures, and the substrate.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device having a landing plug contact structure in accordance with preferred embodiments of the present invention will be described in detail with reference to the accompanying drawings, which is set forth hereinafter.

Figure 1:
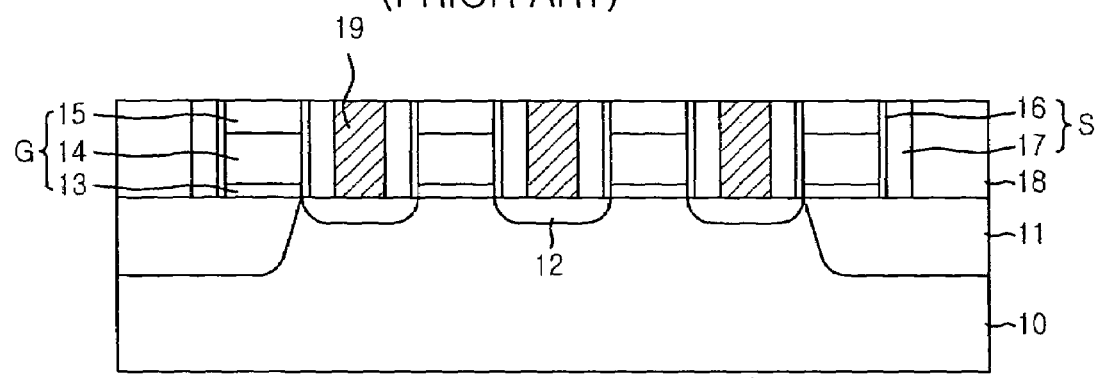
FIG. 1 is a cross-sectional view of a conventional dynamic random access memory (DRAM) device in which a plurality of landing plug contacts is formed.
Figure 2A:
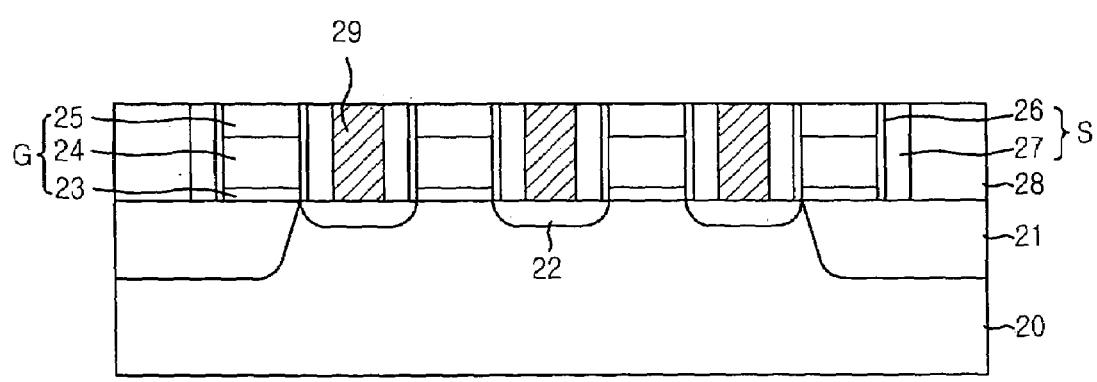
FIGS. 2A and 2B are cross-sectional views illustrating a method for fabricating a DRAM device in accordance with a first embodiment of the present invention.
Figure 2B:
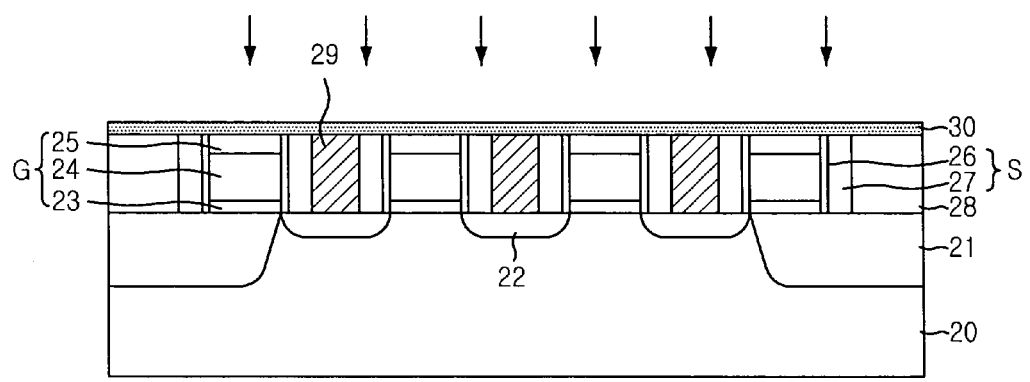

FIGS. 2A and 2B are cross-sectional views illustrating a method for fabricating a dynamic random access memory (DRAM) device in accordance with a first embodiment of the present invention.

Referring to FIG. 2A, a device isolation layer 21 is formed in a substrate 20, thereby defining an active region. A gate oxide layer 23 and a conductive material 24 including polysilicon and/or a metal for use in a gate structure are sequentially formed on the substrate 20. A nitride layer 25 for forming a hard mask is formed on top of the conductive material 24.

Subsequently, the nitride layer 25 is patterned by performing a photolithography process with use of a mask for forming a gate structure. The patterned nitride layer 25 is then used as an etch mask to pattern the conductive material 24 and the gate oxide layer 23. From these sequential steps, a plurality of gate structures G are formed.

Next, an ion implantation of a low concentration for forming a source/drain junction is performed to exposed portions of the active region by using each gate structure G as an ion implantation mask. Afterwards, a dual spacer S including a buffer oxide layer and a nitride layer is formed on sidewalls of the gate structures G. Herein, a first part of the dual spacer S based on the buffer oxide layer will be referred to as an oxide-based spacer denoted with a reference numeral 26, while a second part of the dual spacer S based on the nitride layer will be referred to as a nitride-based spacer denoted with a reference numeral 27. Subsequent to the formation of the dual spacer S, another ion implantation of a high concentration is performed to form source/drain junctions 22.

After the serial ion implantation processes, an inter-layer insulation layer 28 is formed on the above constructed substrate structure and is then etched by employing a photolithography process using a T-shaped mask or an I-shaped mask for forming a landing plug contact (LPC). A polysilicon layer for use in a LPC is formed on an entire surface of the above resulting substrate structure and is then subjected to a chemical mechanical polishing (CMP) process for planarizing the above structure. Herein, the CMP process continues until the patterned nitride layer 25 is exposed, and from this CMP process, a plurality of LPCs 29 are formed.

Referring to FIG. 2B, a passivation layer 30 is formed by ion implanting a high concentration of an N-type dopant to an entire surface of the substrate structure. At this time, phosphorus (P) and arsenic (As) are examples of the N-type dopant. Also, it is preferable to apply implantation energy ranging from approximately 2 KeV to approximately 50 KeV and implantation dose ranging from approximately $1 \times 10^{15}$ ions/cm² to approximately $1 \times 10^{16}$ ions/cm². Thereafter, although not illustrated, another inter-layer insulation layer is formed on the passivation layer 30, and a typical bit line formation process and a capacitor formation process are carried out.

In accordance with the first embodiment of the present invention, the passivation layer 30 doped with a high concentration of the N-type dopant capable of capturing hydrogen ions is formed on top of the oxide-based spacer 26 through which the hydrogen ions generated during the formation of said another inter-layer insulation layer diffuse. Because of the existence of the passivation layer 30, it is possible to prevent hydrogen ions from diffusing into a channel region.

Figure 3A:
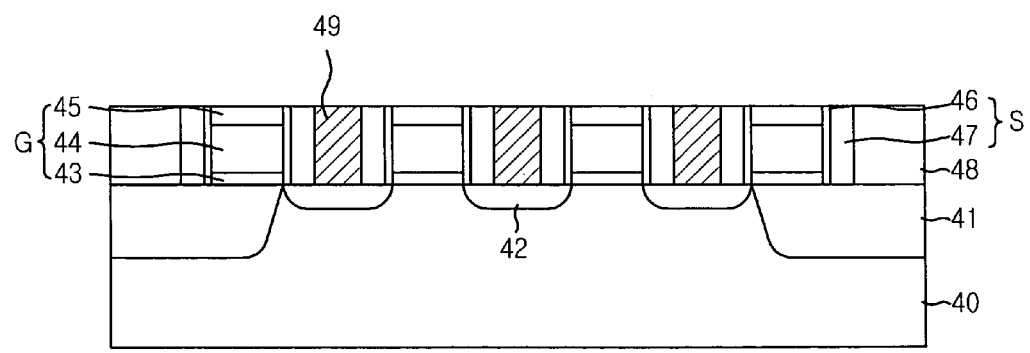
FIGS. 3A and 3B are cross-sectional views illustrating a method for fabricating a DRAM device in accordance with a second embodiment of the present invention.
Figure 3B:
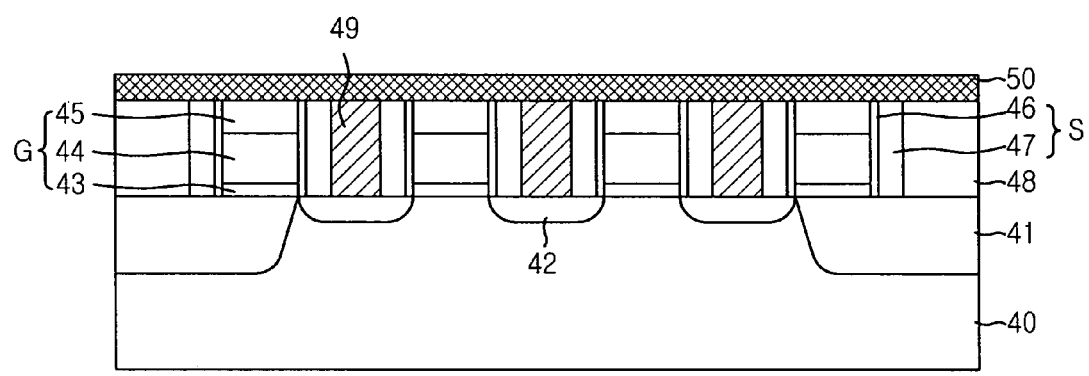

FIGS. 3A and 3B are cross-sectional views illustrating a method for fabricating a DRAM device in accordance with a second embodiment of the present invention.

Referring to FIG. 3A, a device isolation layer 41 is formed in a substrate 40, thereby defining an active region. A gate oxide layer 43 and a conductive material 44 including polysilicon and/or a metal for use in a gate structure are sequentially formed on the above resulting substrate structure. A nitride layer 45 for forming a hard mask is formed on top of the conductive material 44.

Subsequently, the nitride layer 45 is patterned by performing a photolithography process with use of a mask for forming a gate structure. The patterned nitride layer 45 is then used as an etch mask to pattern the conductive material 44 and the gate oxide layer 43. From these sequential steps, a plurality of gate structures G are formed.

Next, an ion implantation of a low concentration for forming a source/drain junction is performed to exposed portions of the active region by using each gate structure G as an ion implantation mask. Then, a dual spacer S including a buffer oxide layer and a nitride layer is formed on sidewalls of the gate structures G. Herein, a first part of the dual spacer S based on the buffer oxide layer will be referred to as an oxide-based spacer denoted with a reference numeral 46, while a second part of the dual spacer S based on the nitride layer will be referred to as a nitride-based spacer denoted with a reference numeral 47. After the formation of the dual spacer S, another ion implantation of a high concentration is performed to form source/drain junctions 42.

Subsequent to the serial ion implantation processes, an inter-layer insulation layer 48 is formed on the above constructed substrate structure and is then etched by employing a photolithography process with use of a T-shaped mask or an I-shaped mask for forming a landing plug contact (LPC). A polysilicon layer for use in a LPC is formed on an entire surface of the above resulting substrate structure and is then subjected to a chemical mechanical polishing (CMP) process for planarizing the above substrate structure. Herein, the CMP process continues until the patterned nitride layer 45 is exposed, and from this CMP process, a plurality of LPCs 49 are formed.

Referring to FIG. 3B, a capping nitride layer 50 is deposited on the planarized substrate structure until a thickness of the capping nitride layer 50 ranges from approximately 50 Å to approximately 500 Å. At this time, the capping nitride layer 50 is preferably formed by employing a low pressure chemical vapor deposition (LPCVD) method or a plasma enhanced chemical vapor deposition (PECVD) method. However, in addition to this preferable use of the LPCVD method or the PECVD method, it is still possible to employ a nitridation method which makes a surface of the substrate 40 nitrided through a conventional nitridation process.

Although not illustrated, another inter-layer insulation layer is formed on the capping nitride layer 50, and a typical bit line formation process and a capacitor formation process are carried out.

In accordance with the second embodiment, it is possible to prevent hydrogen ions from diffusing into a channel region since the capping nitride layer 50 capable of preventing diffusion of hydrogen ions is formed on the oxide-based spacer 46 through which the hydrogen ions generated during the formation of said another inter-layer insulation layer diffuse.

Table 1 provided below shows various device characteristics obtained in cases of employing the conventional method, the first embodiment implemented under the condition of using a dopant of $^{31}P$, implantation energy of approximately 20 KeV and implantation dose of approximately $5 \times 10^{15}$ ions/cm$^2$ and the second embodiment implemented by employing approximately 100 Å of the capping nitride layer.

TABLE 1

|  | Conventional Method | First embodiment | Second embodiment |
| --- | --- | --- | --- |
| Threshold voltage ($V_t$) in cell region | 0.66 V | 0.89 V | 0.88 V |
| Saturation currents of drain ($I_{dsat}$) | 29 µA | 36 µA | 34 µA |
| punch-through breakdown voltage (Bvds) | 2.0 V | 3.8 V | 3.6 V |

As shown in Table 1, compared with the conventional method, those device characteristics such as the threshold voltage ($V_t$) in a cell region, the saturation currents of a drain ($I_{dsat}$) and a punch-through breakdown voltage (Bvds) are improved in the first embodiment and the second embodiment.

Especially, in accordance with the first and the second embodiments, it is possible to prevent hydrogen ions generated during the formation of the inter-layer insulation layer performed after the LPC formation process from diffusing into a channel region. As a result of this effect, it is further possible to improve characteristics of a semiconductor device.

Although the first and the second embodiments of the present invention exemplify the ion implantation of the N-type dopant, the first and the second embodiments of the present invention can be applied to a plasma treatment or a phosphine ($PH_3$) gas doping process which is a widely employed surface treatment technique in addition to the ion implantation process. Herein, in case of employing the plasma treatment, an N-type dopant containing gas can be used a plasma source.

In addition, although the first and the second embodiments exemplify the DRAM fabrication process, these first and the second embodiments can be applied to other processes for fabricating a semiconductor device having a LPC structure.

The present application contains subject matter related to the Korean patent application No. KR 2004-0047263, filed in the Korean Patent Office on Jun. 23, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a plurality of gate structures on a substrate;
    sequentially forming a first spacer and a second spacer on sidewalls of each gate structure;
    forming a plurality of landing plug contacts in predetermined regions created between the gate structures; and
    forming a passivation layer on a resulting substrate structure including the first and the second spacers, the landing plug contacts and the gate structures.

2. The method of claim 1, wherein each of the gate structures includes a hard mask insulation layer, a conductive material and a gate oxide layer.

3. The method of claim 1, wherein the first spacer is formed with a buffer oxide layer, while the second spacer is formed with a nitride layer, respectively.

4. The method of claim 1, further including the step of forming an inter-layer insulation layer on the passivation layer.

5. The method of claim 1, wherein the passivation layer prevents hydrogen ions from diffusing into a channel region.

6. A method for fabricating a semiconductor device, comprising the steps of:
    forming a plurality of gate structures on a substrate;
    sequentially forming a first spacer and a second spacer on sidewalls of each gate structure;
    forming a plurality of landing plug contacts in predetermined regions created between the gate structures; and
    forming a capping nitride layer on a resulting substrate structure including the first and the second spacers, the landing plug contacts, the gate structures and the substrate.

7. A method for fabricating a semiconductor device, comprising:
    forming a plurality of gate structures on a substrate;
    sequentially forming a first spacer and a second spacer on sidewalls of each gate structure;
    forming a plurality of landing plug contacts in predetermined regions between the gate structures; and
    forming a capping nitride layer on a resulting substrate structure including the first and the second spacers, the landing plug contacts, the gate structures and the substrate,
    wherein at the step of forming the capping nitride layer, the capping nitride layer is formed by employing one of a low pressure chemical vapor deposition (LPCVD) method and a plasma enhanced chemical vapor deposition (PECVD) method.

8. The method of claim 6, wherein at the step of forming the capping nitride layer, the capping nitride layer is obtained through the use of a nitridation process which makes a surface of the substrate nitrided.

9. The method of claim 7, wherein the capping nitride layer has a thickness ranging from approximately 50 Å to approximately 500 Å.

10. The method of claim 8, wherein the capping nitride layer has a thickness ranging from approximately 50 Å to approximately 500 Å.

11. The method of claim 6, wherein the first spacer is formed with a buffer oxide layer, while the second spacer is formed with a nitride layer, respectively.

12. The method of claim 6, wherein each of the gate structures includes a hard mask insulation layer, a conductive material and a gate oxide layer.

13. The method of claim 6, further including the step of forming an inter-layer insulation layer on the capping nitride layer.

14. The method of claim 1, wherein the passivation layer is formed by doping an N-type dopant to a resulting substrate structure including the first and the second spacers, the landing plug contacts, the gate structures and the substrate.

15. The method of claim 14, wherein the N-type dopant is doped by applying ion implantation energy ranging from approximately 2 KeV to approximately 50 KeV and ion implantation dose ranging from approximately $1 \times 10^{15}$ ions/$cm^2$ to approximately $1 \times 10^{16}$ ions/$cm^2$.

16. The method of claim 14, wherein the N-type dopant is one of phosphorus (P) and arsenic (As).

17. The method of claim 14, wherein the passivation layer is doped by employing a plasma treatment using a gas containing the N-type dopant.

18. The method of claim 14, wherein the N-type dopant is doped by employing a phosphine ($PH_3$) gas doping process.

* * * * *